(12) United States Patent
Tung

(10) Patent No.: US 6,291,303 B1
(45) Date of Patent: Sep. 18, 2001

(54) METHOD FOR MANUFACTURING A BIPOLAR JUNCTION DEVICE

(75) Inventor: Ming-Tsung Tung, Hsinchu Hsien (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/215,643

(22) Filed: Dec. 16, 1998

(51) Int. Cl.$^7$ .................................................. H01L 21/8224
(52) U.S. Cl. ............................................. 438/336; 438/327
(58) Field of Search .................................... 438/327, 324, 438/309, 312, 316, 318, 335, 336, 353, 362, 510, 514, 313

(56) References Cited

U.S. PATENT DOCUMENTS

| | | | |
|---|---|---|---|
| 4,120,707 | * | 10/1978 | Beasom ................................ 438/208 |
| 4,403,395 | * | 9/1983 | Curran ................................ 438/234 |
| 4,966,858 | * | 10/1990 | Masquelier et al. .................. 438/294 |
| 5,066,602 | * | 11/1991 | Takemoto et al. .................... 438/203 |
| 5,163,178 | * | 11/1992 | Gomi et al. .......................... 257/558 |
| 5,360,750 | * | 11/1994 | Yang .................................. 438/335 |
| 5,489,541 | * | 2/1996 | Yang et al. .......................... 438/365 |

OTHER PUBLICATIONS

Silicon Processing for the VLSI Era vol. 3: The Submicron Mosfet, Sunset Beach, CA, 1995, pp. 557–560.*
Wolf, S., Tauber R.N.; Silicon Processing for the VLSI Era vol. 1: Process Technology, Lattice Press, Sunset Beach, CA, 1986, pp. 124, 280–283.*

* cited by examiner

*Primary Examiner*—John F. Niebling
*Assistant Examiner*—Christopher Lattin

(57) ABSTRACT

A method of forming an improved bipolar junction device structure. By forming a well region around the emitter terminal, the area of distribution of ions within the emitter terminal of a vertical bipolar junction transistor is enlarged. Furthermore, by forming a separate well region around the emitter terminal and the collector terminal, the area of distribution of ions within the emitter terminal and the collector terminal of a lateral bipolar junction transistor is also enlarged.

6 Claims, 4 Drawing Sheets

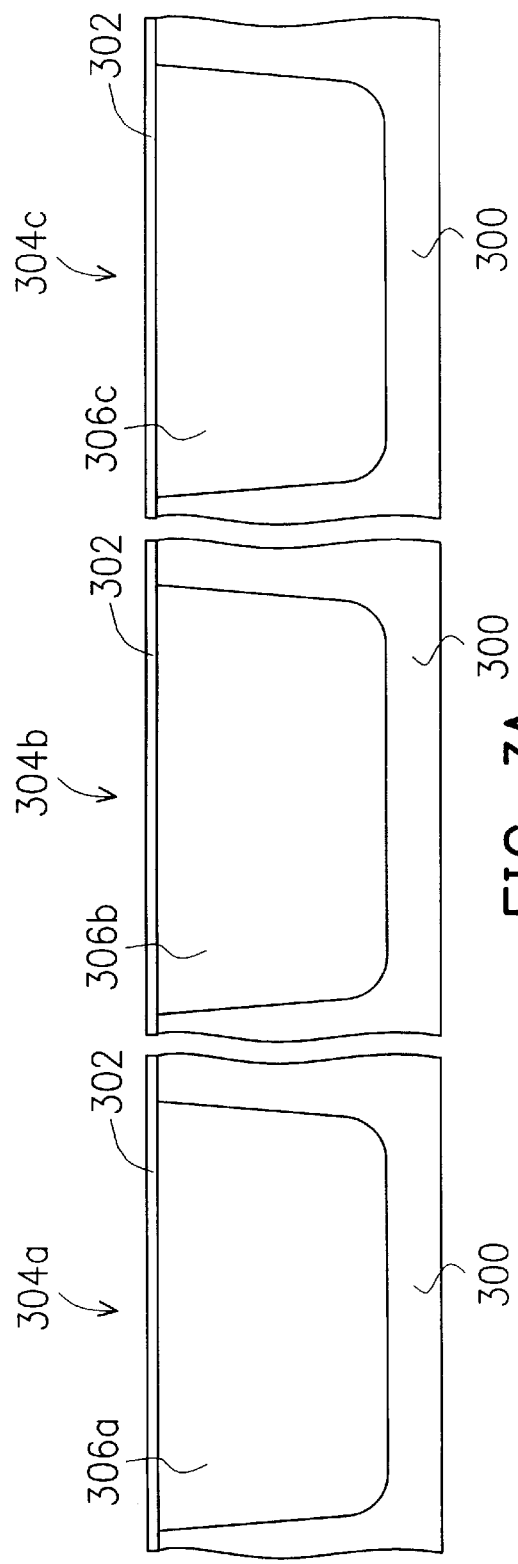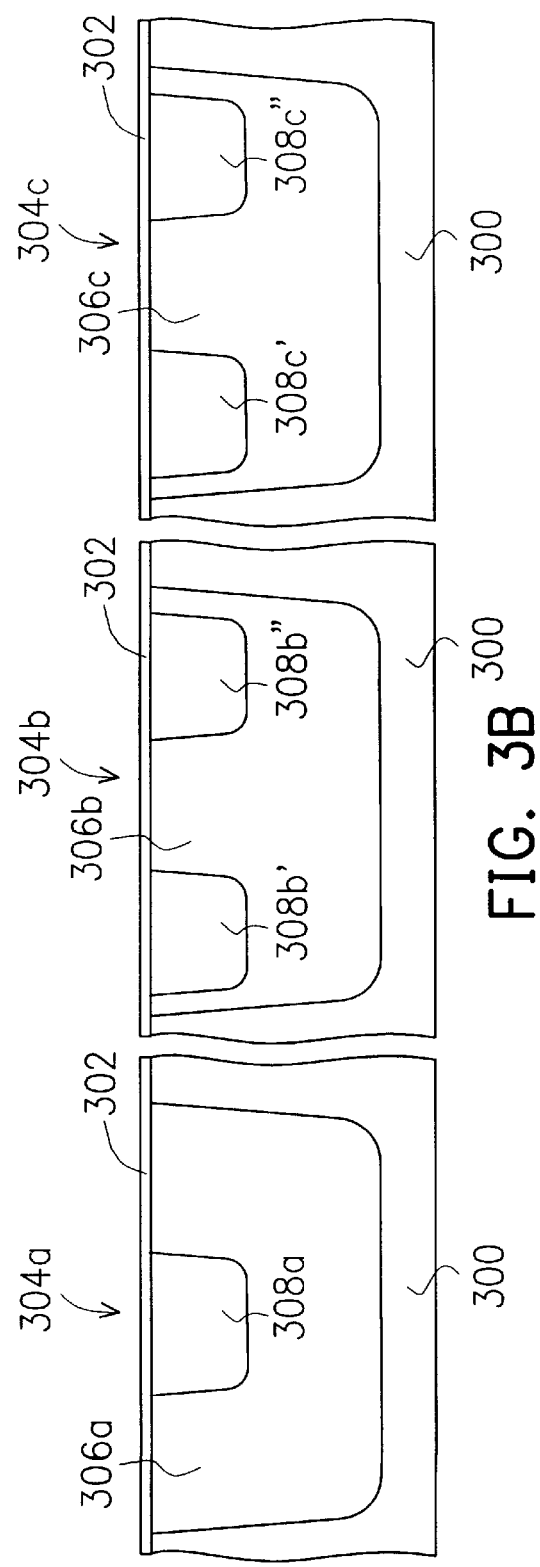

METHOD FOR MANUFACTURING A BIPOLAR JUNCTION DEVICE

BACKGROUND OF THE INVENTION

1. Field of Invention

The present invention relates to a bipolar junction device structure and its method of manufacture. More particularly, the present invention relates to a high-voltage compatible, bipolar junction device structure and its method of manufacture.

2. Description of Related Art

In some high-voltage circuit design, parasitic dipolar devices are often required. However, because earlier versions of the vertical bipolar junction transistor (BJT) have a large base width or lack a double diffusion drain (DDD) structure, gain of the transistor is too small. Yet, a lateral bipolar transistor has an even smaller gain, and hence its applications are even more restrictive.

FIG. 1 is a cross-sectional view showing a conventional vertical bipolar junction transistor. In FIG. 1, the substrate 100 is an N-doped region. The substrate 100 serves as a collector for the bipolar transistor, and the N$^+$region 102 acts as a contact area for the collector. The well 104 is a P-doped region acting as a base, and the P$^+$regions 106 serve as contact areas for the base. The emitter 108 is another N$^+$region within the P-well 104.

The structure shown in FIG. 1 is a typical npn vertical bipolar junction transistor. When proper voltages are applied, electrons are emitted from the emitter 108 through the base 104 and inject into the substrate 100, which serves as a collector. The path taken by the electrons is known as the base width and is represented by w in FIG. 1. Since base width of a conventional vertical BJT is rather large, gain of the transistor is small. Hence, efficiency of the device is low.

FIG. 2 is a cross-sectional view showing a conventional lateral bipolar junction transistor. In FIG. 2, the substrate 200 is an N-doped region. The substrate 200 has a well region 202. The well 202 is a P-doped region serving as a base. The P$^+$region 204 within the well 202 serves as a contact area for the base. The emitter 206 and the collector 208 are two N$^+$regions formed on each side of the P$^+$base region 204 within the well 202. The structure shown in FIG. 2 is a typical npn lateral bipolar junction transistor.

Due to the presence of a contact area 204 between the emitter 206 and the collector 208, the rate of movement of electrons from the emitter 206 to the collector 208 is greatly reduced. Moreover, some electrons may be absorbed within the contact area 204. Therefore, gain of the lateral bipolar junction transistor is even less than the vertical BJT and more restrictions are imposed upon circuit applications.

In light of the foregoing, there is a need to provide an improved bipolar junction transistor structure.

SUMMARY OF THE INVENTION

Accordingly, the present invention provides a vertical bipolar junction transistor having a smaller base width such that a larger gain for the transistor is obtained.

In another aspect, the invention provides a lateral bipolar junction transistor having a higher gain that can be used in circuits requiring different voltage sources.

To achieve these and other advantages and in accordance with the purpose of the invention, as embodied and broadly described herein, the invention provides a method of forming a bipolar junction device on a substrate of the first conductive type. Three regions including a first region, a second region and a third region are patterned out of a substrate. A vertical npn bipolar junction transistor, a lateral npn bipolar junction transistor and a lateral pnp bipolar junction transistor are formed in the first region, the second region and the third region respectively.

The method includes the steps of forming a P-type first well in both the first region and the second region, and an N-type first well in the third region. Thereafter, an N-type second well is formed within the P-type first well of the first region, two mutually isolated N-type second wells are formed within the P-type first well of the second region, and two mutually isolated P-type second wells are formed within the N-type first well of the third region.

Next, isolating structures are formed in neighboring areas between the first, second, third regions and the first wells as well as the neighboring areas between the first well and the second well. Subsequently, an N-type first doped region is formed within the second well of the first region, two mutually isolated N-type first doped regions are formed in the second well of the second region, and an N-type first doped region is formed in the first well of the third region.

Thereafter, two mutually isolated P-type second doped regions are formed within the first well of the first region, a P-type second doped region is formed within the first well of the second region, and then two mutually isolated P-type second doped regions are formed within the second well of the third region.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

FIGS. 3A through 3F are cross-sectional views showing the progression of manufacturing steps in producing a bipolar junction transistor according to one preferred embodiment of this invention.

DESCRIPTION OF THE PREFERRED EMBODIMENTS

Figure 1:
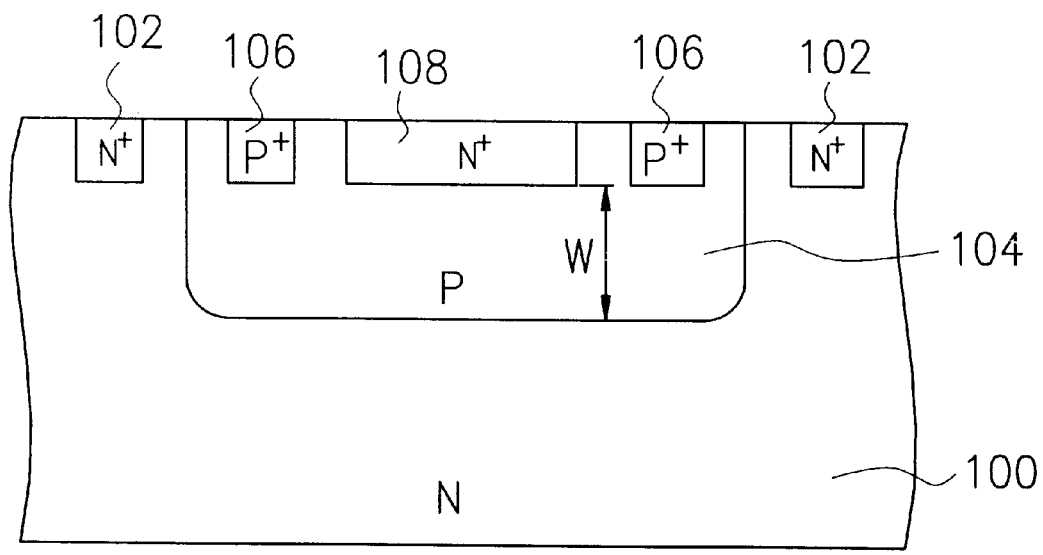
FIG. 1 is a cross-sectional view showing a conventional vertical bipolar junction transistor.
Figure 2:
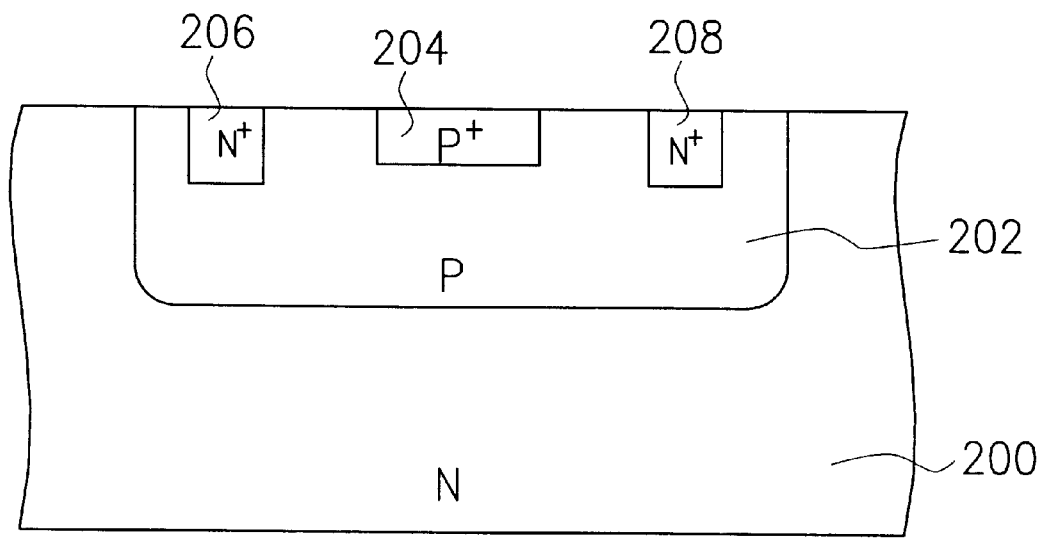
FIG. 2 is a cross-sectional view showing a conventional lateral bipolar junction transistor.

Reference will now be made in detail to the present preferred embodiments of the invention, examples of which are illustrated in the accompanying drawings. Wherever possible, the same reference numbers are used in the drawings and the description to refer to the same or like parts.

Because a conventional vertical bipolar junction transistor has a wide base that leads to a small gain, and because the gain of a conventional lateral bipolar junction transistor is even smaller a better method of forming a bipolar junction transistor is provided. The bipolar junction transistor of this invention has a higher gain, and therefore a higher working efficiency. FIGS. 3A through 3I are cross-sectional views showing the progression of manufacturing steps in producing a bipolar junction transistor according to one preferred embodiment of this invention.

Figure 3C:
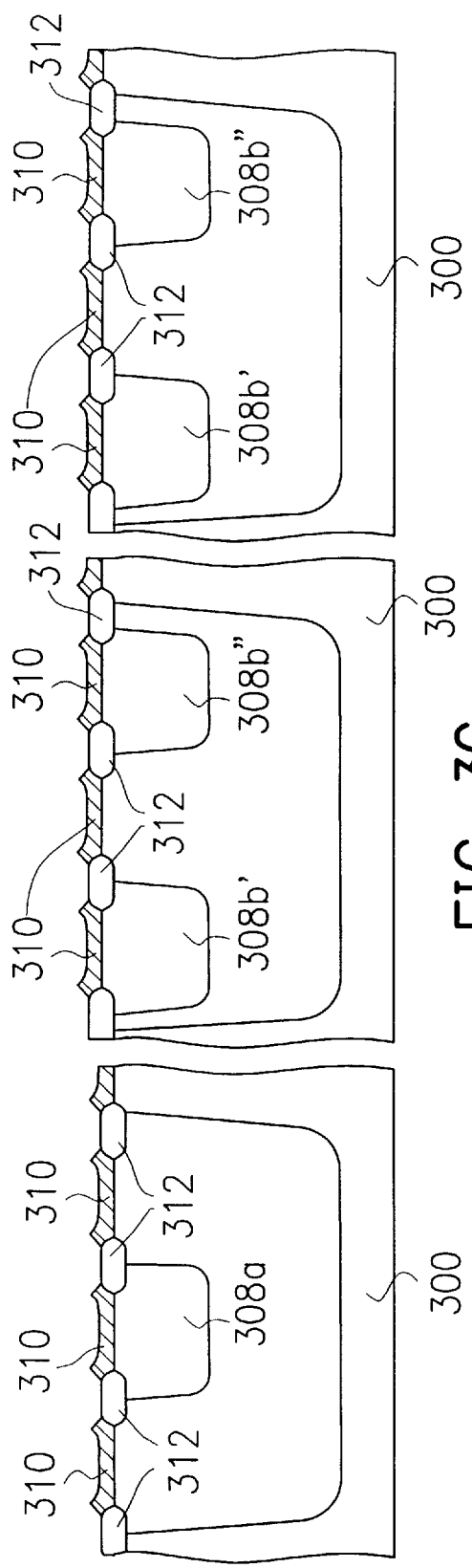

The process of simultaneously forming a vertical npn, a lateral npn and a lateral pnp bipolar junction transistor above a substrate is given as an example with reference to FIGS. 3A through 3F. First, as shown in FIG. 3A, an oxide layer 302 is formed over an N-type semiconductor substrate 300. The oxide layer 302 protects the substrate 300 against damage in subsequent ion implant operations.

Thereafter, P-type wells 306a are formed inside region 304a and P-type wells 306b are formed inside region 304b, wherein a vertical npn and a lateral npn bipolar junction transistor will be formed inside regions 304a and 304b, respectively. The P-type wells 306a and 306b are formed by forming a mask layer over the substrate 300 and other regions while exposing the regions 304a and 304b, and then performing a P-type ion implantation.

Next, an N-type well 306c is formed inside the region 304c by performing an N-type ion implantation, wherein a lateral pnp bipolar junction transistor will be formed inside region 304c. Subsequently, a drive-in operation is carried out to spread out the doped ions inside various well regions. The substrate 300 within the region 304a acts as a collector of the vertical npn bipolar junction transistor (BJT), and the well region 306a acts as a base of the vertical npn BJT. Furthermore, the well region 306b within the region 304b acts as a base of the lateral npn BJT, and the well region 306c within the region 304c acts as a base of the lateral pnp BJT.

Next, as shown in FIG. 3B, N-type ions are implanted into well regions 306a and 306b within regions 304a and 304b, respectively. Consequently, an N-well 308a is formed within well region 306a, and N-wells 308b' and 308b" are formed within well region 306b. The N-wells 308a, 308b' and 308b" are formed by covering areas outside regions 304a and 304b before carrying out the necessary ion implantation. The N-type well 308a within the region 304a is isolated from the substrate 300 by the P-type well 306a.

Furthermore the N-type wells 308b' and 308b" within the region 306b are isolated from each other and the substrate 300 by the P-type well 306a. Thereafter, a mask layer is formed over the regions 304a and 304b, and then two P-type wells 308c' and 308c" are formed within the N-well 306c by a P-type ion implantation. The two P-type wells 308c' and 308c" are isolated from each other and from the substrate 300 by the N-well 306c. Next, a drive-in operation is carried out to spread out the doped ions with the well regions. The well 308a within the region 304a acts as an emitter of the vertical npn bipolar junction transistor. The wells 308b' and 308b" within the region 304b act respectively as a collector and an emitter of the lateral npn bipolar junction transistor. In addition, the wells 308c' and 308c" within the region 304c act respectively as a collector and an emitter of the lateral pnp bipolar junction transistor.

Thereafter, the oxide layer 302 is removed, and then an operation to form isolation structure above the substrate 300 is carried out. Any conventional method for forming the isolation structure can be used as shown in FIG. 3C. First, a pad oxide layer (not shown) is formed over the substrate 300. Subsequently, a silicon nitride layer is formed over the pad oxide layer, and then the silicon nitride layer is patterned to form silicon nitride layers 310 over substrate areas where ion implantation is desired. Next, a thermal oxidation method is used to form isolation structures 312, for example, field oxide regions or shallow trench isolation structures.

The isolation structure 312 is formed between well regions and in the neighborhood junction between the well region and the substrate. For example, isolation structures 312 are formed in the neighborhood of the junction between well 306a and well 308a within the region 304a and between well 306a and the substrate 300. Similarly, isolation structures are also formed within regions 304b and 304c.

Figure 3D:
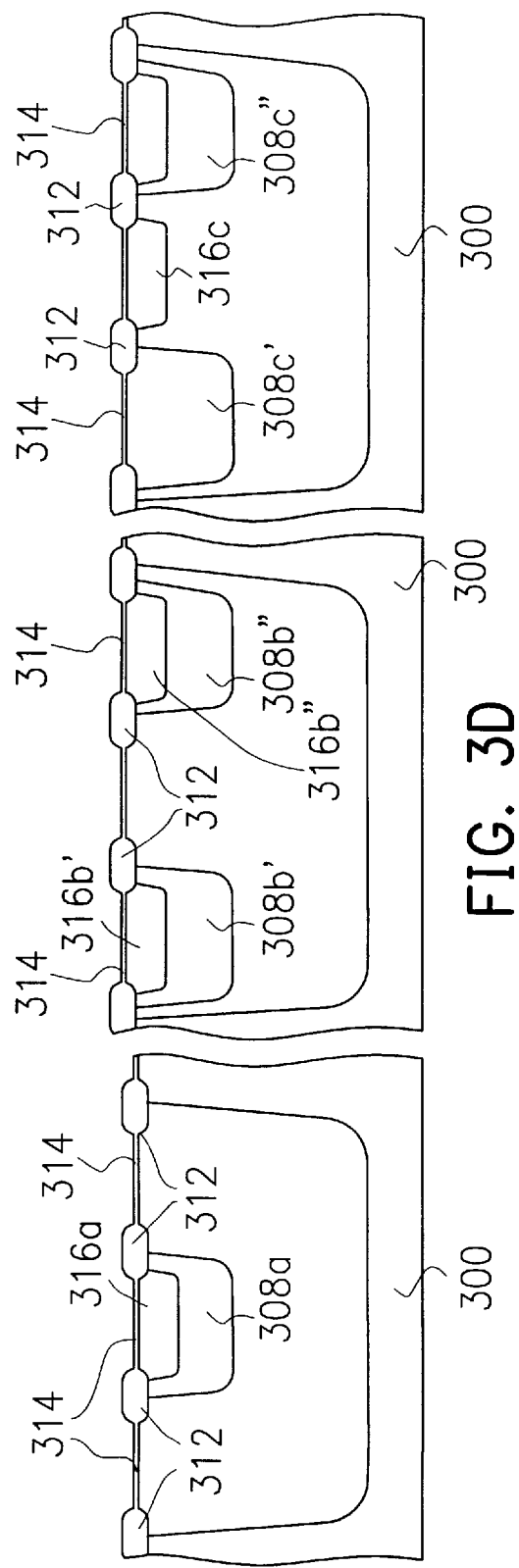

Next, the silicon nitride layers 310 and the pad oxide layer are removed, exposing a portion of the substrate 300. Then, an oxide layer 314 is formed over the substrate as shown in FIG. 3D. The oxide layer 314 is used for protecting the substrate 300 against damages due to subsequent ion implantation operation. Thereafter, N-type ions are implanted into the well 308a within the region 304a, the wells 308b' and 308b" within the region 304b, and the well 306c within the region 304c.

Hence, N$^+$doped regions 316a, 316b', 316b", 316c are formed within well regions 308a, 308b', 308b" and 306c, respectively. The N$^+$doped region 316a acts as a contact area for the emitter of the vertical npn BJT, while the N$^+$doped regions 316b' and 316b" respectively act as contact areas for the collector and the emitter of the lateral npn BJT, and the N$^+$doped region 316c acts as a contact area from the base of the lateral pnp BJT.

Figure 3E:
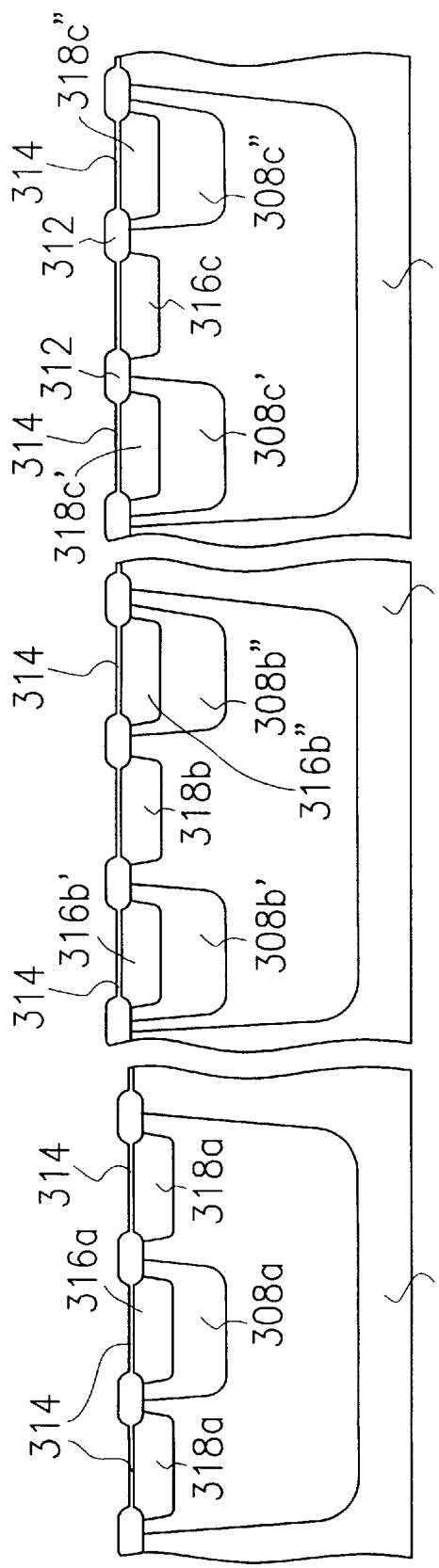

Next, as shown in FIG. 3E, a P-type ion implantation of the substrate 300 is carried out. First, regions not requiring ion implantation are covered by a mask, and then P-type ions are implanted to form P$^+$doped regions 318a within well 306a in the region 304a, P$^+$doped region 318b within well 306b in the region 304b, and P$^+$doped regions 318c', and 318c" within respective wells 308c' and 308c" in the region 304c. The P$^+$doped regions 318a act as a contact area for the base of vertical npn BJT.

The P$^+$doped region 318b acts as a contact area for the base of the lateral npn BJT. The P$^+$doped regions 318c' and 318c" act respectively as contact areas with the collector and the emitter of the lateral pnp BJT. Subsequently an annealing of the substrate is performed so that impurities are more evenly distributed within the doped regions.

Figure 3F:
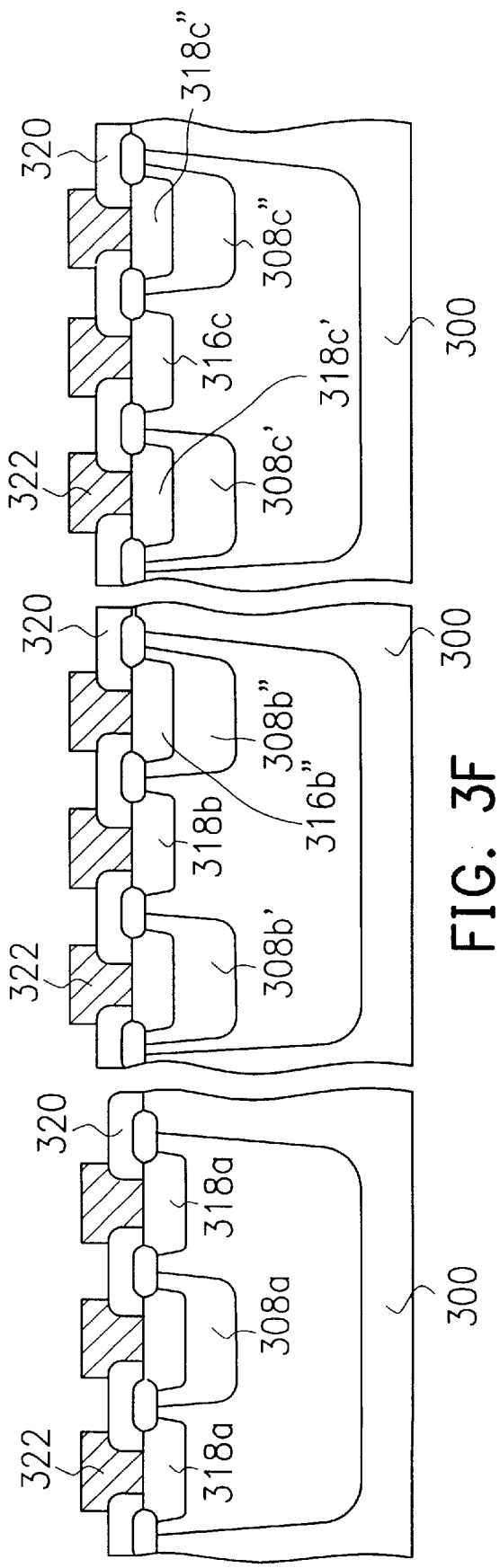

Next, as shown in FIG. 3F, conventional techniques are used to form an insulating layer 320 over the substrate 300. The insulating layer 320 is patterned to form contact openings. Thereafter, a metallic layer 327 is formed, and then the metallic layer 322 is patterned to form outlet lines for applying voltages to the respective emitter, base and collector terminals of the bipolar junction transistor.

In summary, this invention forms an additional well region around the emitter contact area of the vertical npn BJT, the emitter and collector contact areas of the lateral npn BJT, the emitter and collector contact areas of the lateral pnp BJT so that ions are distributed in a wider area. Consequently, for a npn BJT, the formation of a well region around the emitter contact area shortens the distance between a substrate of the emitter and the emitter itself. In other words, the base width of the BJT is reduced. Hence, gain of the npn bipolar junction transistor is increased, and efficiency of the device is improved. For a lateral BJT, the formation of an emitter and a collector well region facilitates a wider distribution of ions. Therefore, carriers can pass from the emitter terminal to the collector terminal via a route further away from the base contact area. Hence, carriers are less likely to be absorbed by the base contact, thereby increasing the gain of the device.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalent.

What is claimed is:

1. A method of manufacturing a bipolar junction device suitable for formation above a substrate of a first conductive type such that the substrate is patterned into a first region a second region and a third region, wherein the first region is used for forming a vertical npn bipolar junction transistor, the second region is used for forming a lateral npn bipolar junction transistor, and the third region is used for forming a lateral pnp bipolar junction transistor, the method comprising the steps of:

forming a P-type first well in the first region and the second region, and forming an N-type first well in the third region;

forming an N-type second well within the first well in the first region, two mutually isolated N-type second wells within the first well in the second region, and two mutually isolated P-type second wells within the first well in the third region;

forming a plurality of isolation structures in the first, second and third regions in the neighborhood of junctions between the substrate and the first well as well as between the first well and the second well;

forming an N-type first doped region within the second well in the first region, two mutually isolated N-type first doped regions within the two second wells in the second region, and an N-type first doped region within the first well in the third region; and forming two mutually isolated P-type second doped regions within the first well in the first region, a P-type second doped region within the first well in the second region, and two P-type second doped regions within the second wells in the third region.

2. A method of manufacturing a bipolar junction device suitable for formation above a substrate of a first conductive type such that the substrate is patterned into a first region, a second region and a third region, wherein the first region is used for forming a vertical bipolar junction transistor, the second region is used for forming a first lateral bipolar junction transistor, and the third region is used for forming a second lateral bipolar junction transistor, the method comprising the steps of:

forming a first well of a second conductive type in the first region and the second region, and forming a first well of the first conductive type in the third region;

forming a second well of the first conductive type within the first well in the first region, two mutually isolated second wells of the first conductive type within the first well in the second region, and two mutually isolated second wells of the second conductive type within the first well in the third region;

forming a plurality of isolation structures in the first, second and third regions in the neighborhood of junctions between the substrate and the first well and between the first well and the second well;

forming a first doped region of the first conductive type within the second well in the first region, two mutually isolated first doped regions of the first conductive type within the two second wells in the second region, and a first doped region of the first conductive type within the first well in the third region; and forming two mutually isolated second doped regions of the second conductive type within the first well in the first region, a second doped region of the second conductive type within the first well in the second region, and two second doped regions of the second conductive type within the second wells in the third region.

3. The method of claim 2, wherein the first conductive type comprises a P-type while the second conductive type comprises an N-type.

4. A method of manufacturing a bipolar junction device suitable for formation above a substrate of a first conductive type such that the substrate is patterned into a first region and a second region, wherein the first region is used for forming a vertical bipolar junction transistor, and the second region is used for forming a first lateral bipolar junction transistor, the method comprising the steps of:

forming a first well of a second conductive type in the first region and the second region;

forming a second well of the first conductive type within the first well in the first region, and two mutually isolated second wells of the first conductive type within the first well in the second region;

forming a plurality of isolation structures in the first region and the second region in the neighborhood of junctions between the substrate and the first well and between the first well and the second well;

forming a first doped region of the first conductive type within the second well in the first region, and two mutually isolated first doped regions of the first conductive type within the two second wells in the second region; and forming two mutually isolated second doped regions of the second conductive type within the first well in the first region, and a second doped region of the second conductive type within the first well in the second region.

5. The method of claim 4, wherein the first conductive type comprises an N-type while the second conductive type comprises a P-type.

6. The method of claim 4, wherein the first conductive type comprises a P-type while the second conductive type comprises an N-type.

* * * * *